(12) United States Patent
Cha et al.

(10) Patent No.: US 11,073,434 B2
(45) Date of Patent: Jul. 27, 2021

(54) MANUFACTURING METHOD FOR SHEAR AND NORMAL FORCE SENSOR

(71) Applicant: KOREA INSTITUTE OF SCIENCE AND TECHNOLOGY, Seoul (KR)

(72) Inventors: Youngsu Cha, Seoul (KR); Ye Rim Lee, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 16/703,114

(22) Filed: Dec. 4, 2019

(65) Prior Publication Data
US 2021/0025767 A1    Jan. 28, 2021

(30) Foreign Application Priority Data

Jul. 25, 2019  (KR) .................. 10-2019-0090183

(51) Int. Cl.
*H01L 41/29*    (2013.01)
*G01L 1/16*    (2006.01)
(Continued)

(52) U.S. Cl.
CPC .............. *G01L 1/16* (2013.01); *G01L 5/0061* (2013.01); *H01L 41/0475* (2013.01);
(Continued)

(58) Field of Classification Search
CPC . H01L 41/0475; H01L 41/29; H01L 41/1132; H01L 41/1136; H01L 41/193;
(Continued)

(56) References Cited

U.S. PATENT DOCUMENTS 5,720,099 A * 2/1998 Parker .................. Y10T 29/42
216/13
5,991,988 A * 11/1999 Tabota ............... H01L 41/1132
264/430
(Continued)

FOREIGN PATENT DOCUMENTS

EP     2 953 012 A1    12/2015
JP     07-019975 A     1/1995
(Continued)

OTHER PUBLICATIONS

Machine Translation (English) of Japanese Patent Publication, JP 7-19975, Jan. 1995. (Year: 2021).*

*Primary Examiner* — A. Dexter Tugbang
(74) *Attorney, Agent, or Firm* — Rabin & Berdo, P.C.

(57) ABSTRACT

Provided are a method of manufacturing a shear and normal force sensor including fabricating raised and sunken polymers having a plurality of bent parts of bent shapes, forming an electrode pattern on one surface of a piezoelectric element, and embedding the piezoelectric element between the raised and sunken polymers, and a shear and normal force sensor including raised and sunken polymers having a plurality of bent parts of bent shapes, a piezoelectric element embedded between the raised and sunken polymers and having an electrode pattern on one surface, and a flexible printed circuit board (FPCB) embedded between the sunken polymer and the piezoelectric element and electrically connected to the electrode pattern.

6 Claims, 14 Drawing Sheets

(51) Int. Cl.
    *G01L 5/00* (2006.01)
    *H01L 41/047* (2006.01)
    *H01L 41/45* (2013.01)
    *H01L 41/193* (2006.01)
    *H01L 41/113* (2006.01)

(52) U.S. Cl.
    CPC ...... *H01L 41/1132* (2013.01); *H01L 41/1136* (2013.01); *H01L 41/193* (2013.01); *H01L 41/29* (2013.01); *H01L 41/45* (2013.01)

(58) Field of Classification Search
    CPC ......... H01L 41/45; G01L 5/0061; G01L 1/16; Y10T 29/42
    See application file for complete search history.

(56) References Cited

U.S. PATENT DOCUMENTS

| | | | |
|---|---|---|---|
| 6,637,276 B2 | 10/2003 | Adderton et al. | |
| 2007/0152537 A1* | 7/2007 | Yamaguchi | G01L 1/16 310/311 |
| 2010/0207489 A1* | 8/2010 | Huang | Y10T 29/42 310/336 |
| 2012/0247217 A1* | 10/2012 | Suzuki | Y10T 29/42 73/717 |
| 2013/0214645 A1* | 8/2013 | Mizusawa | H01L 41/29 310/344 |
| 2014/0159547 A1* | 6/2014 | Jun | H01L 41/1136 310/339 |
| 2014/0191221 A1* | 7/2014 | Benwadih | H01L 41/1132 257/40 |
| 2015/0059486 A1 | 3/2015 | Choong et al. | |
| 2017/0033275 A1* | 2/2017 | Choi | H01L 41/1132 |

FOREIGN PATENT DOCUMENTS

| | | | |
|---|---|---|---|
| JP | 07019975 A | * | 1/1995 |
| JP | 2013007734 A | * | 1/2013 |
| JP | 2013072837 A | | 4/2013 |
| KR | 10-2011-0124964 A | | 11/2011 |
| KR | 1020140074461 A | | 6/2014 |
| KR | 10-2015-0028125 A | | 3/2015 |
| KR | 10-2015-0114509 A | | 10/2015 |
| KR | 10-2019-0045460 A | | 5/2019 |

* cited by examiner

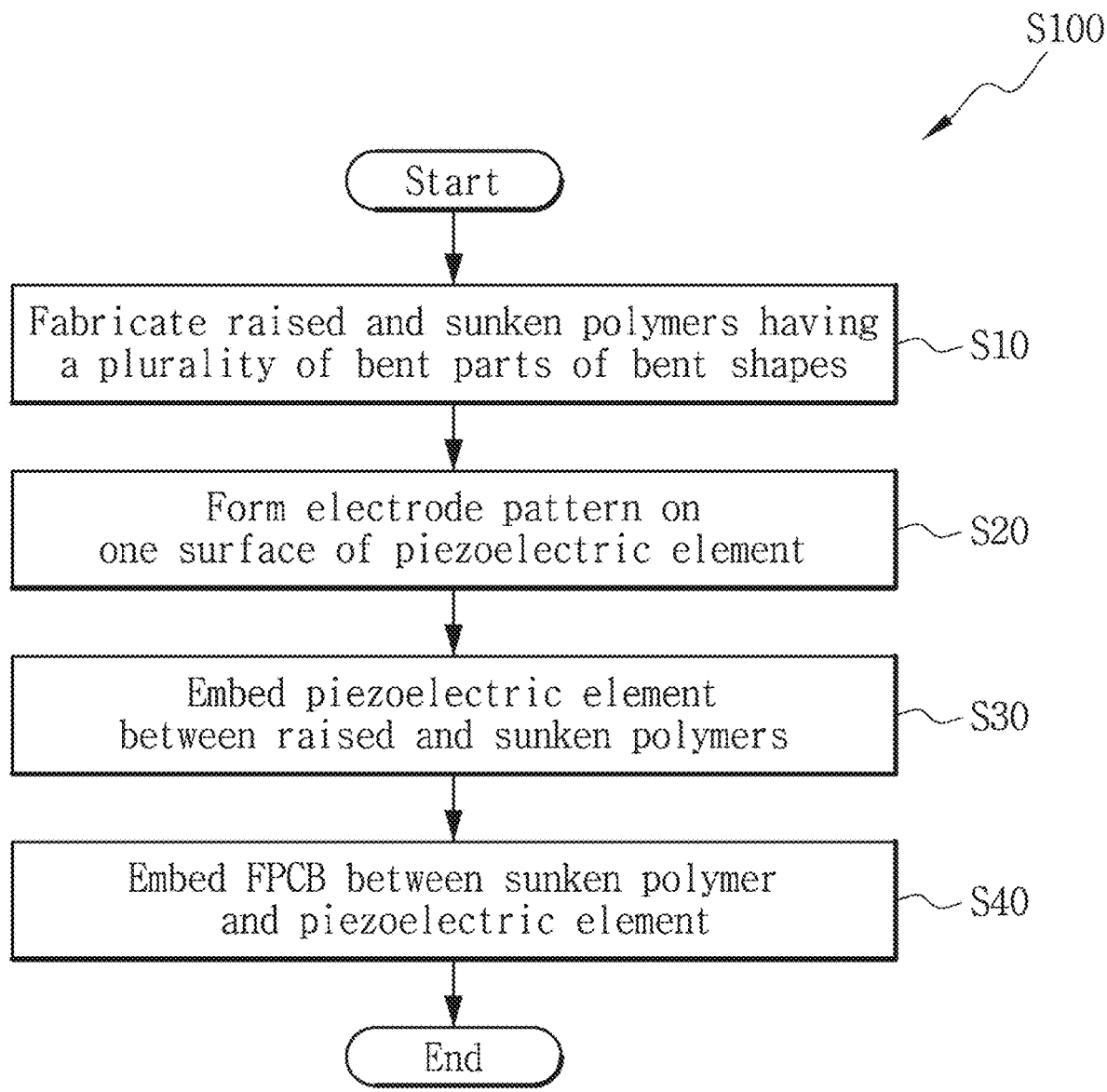

MANUFACTURING METHOD FOR SHEAR AND NORMAL FORCE SENSOR

CROSS-REFERENCE TO RELATED APPLICATION

This application claims priority to Korean Patent Application No. 10-2019-0090183, filed on Jul. 25, 2019, and all the benefits accruing therefrom under 35 U.S.C. § 119, the contents of which in its entirety are herein incorporated by reference.

DESCRIPTION OF GOVERNMENT-FUNDED RESEARCH AND DEVELOPMENT

This research is conducted by Industry-University Cooperation Foundation Hanyang University ERICA Campus, and funded by robotics industry core technology development (R&D) of Korea Evaluation Institute of Industrial Technology, Ministry of Trade, Industry and Energy, Republic of Korea (Development of robotic work control technology capable of grasping and manipulating various objects in everyday life environment based on multimodal recognition and using tools, No. 1415162747).

BACKGROUND

1. Field

The present disclosure relates to a shear and normal force sensor, and more particularly, to a shear and normal force sensor using a piezoelectric effect.

2. Description of the Related Art

Recently, with the development of wearable electronics and intelligent robots, the importance of flexible tactile sensors has increased. In this context, various studies have been conducted to sense external inputs such as proximity, strain and pressure.

Among these sensors, force sensors are widely used in the field of robotics to realize the functions of robotic manipulation with a feedback system and object classification. At the same time, sensing normal and shear forces is very important when sensing forces. In practice, it is because most of forces act as a combination of normal force and shear force.

Force sensors that can sense shear and normal forces have been widely studied. Such sensors make use of the piezoelectric, piezo-resistive, and capacitive properties of materials. Among these sensors, the capacitive ones have excellent sensitivity, large dynamic range, and good spatial resolution. The piezo-resistive ones have a high spatial resolution and a simple construction. They require bias voltage, which consumes electric power.

In contrast, the piezoelectric ones have an advantageous characteristic of being self-powered, i.e., generating electrical signals in response to external mechanical inputs. With this benefit, some studies have been made on piezoelectric force sensors that can measure shear forces. Specifically, some researchers have assembled polydimethylsiloxane (PDMS) bump structures on flat or micropillar-type polyvinylidene fluoride (PVDF) and have used electrodes of specific shapes for effective sensing, in order to detect shear and normal forces. This manufacturing method is difficult to perform due to the processes such as lithography and sputtering.

In general, PVDF is used as a measuring material due to its flexibility, biocompatibility and outstanding performance.

Accordingly, there is a need for a method of manufacturing a force sensor that senses shear and normal forces, through a simple process using PVDF and PDMS.

SUMMARY

The present disclosure is directed to providing a method of manufacturing a shear and normal force sensor for sensing the magnitude and direction of a force applied to the sensor in real time.

The present disclosure is further directed to providing a shear and normal force sensor that can be manufactured through a simple process using polyvinylidene fluoride (PVDF) and polydimethylsiloxane (PDMS).

To achieve the above-described object, a method of manufacturing a shear and normal force sensor according to the present disclosure includes fabricating raised and sunken polymers having a plurality of bent parts of bent shapes, forming an electrode pattern on one surface of a piezoelectric element, and embedding the piezoelectric element between the raised and sunken polymers.

In accordance with an example related to the present disclosure, the method of manufacturing a shear and normal force sensor according to the present disclosure may further include embedding a flexible printed circuit board (FPCB) between the sunken polymer and the piezoelectric element.

The bent part may have a trapezoidal shape.

In accordance with another example related to the present disclosure, shapes of the raised and sunken polymers may match each other.

In accordance with still another example related to the present disclosure, each of the raised and sunken polymers may be made of PDMS.

The piezoelectric element may be made of PVDF.

To achieve another object, a shear and normal force sensor includes raised and sunken polymers having a plurality of bent parts of bent shapes, a piezoelectric element embedded between the raised and sunken polymers and having an electrode pattern on one surface, and a FPCB embedded between the sunken polymer and the piezoelectric element and electrically connected to the electrode pattern.

BRIEF DESCRIPTION OF THE DRAWINGS

FIG. 1 is a flowchart showing a method of manufacturing a shear and normal force sensor according to the present disclosure.

DETAILED DESCRIPTION

Figure 2A:
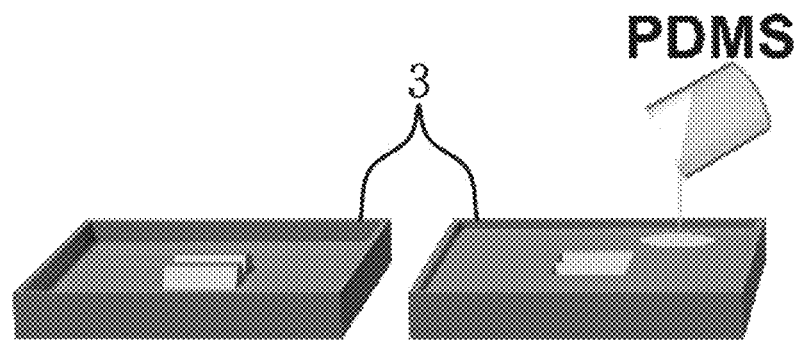
FIG. 2A is a perspective view showing a process of fabricating top and bottom polydimethylsiloxane (PDMS).

Hereinafter, the disclosed embodiments will be described in detail with reference to the accompanying drawings, and identical or similar elements are given identical or similar reference signs and redundant descriptions are omitted herein. As used herein, the suffix "part" in the elements is only given or used to ease the drafting of the specification, and does not have any meaning or role for identifying itself. Additionally, in describing the embodiments disclosed herein, when a certain detailed description of relevant known technology is determined to render the key subject matter of the disclosed embodiments ambiguous, the detailed description is omitted herein. Additionally, the accompanying drawings are provided for an easy understanding of the disclosed embodiments, and the technical spirit disclosed herein is not limited by the accompanying drawings, and it should be understood that the present disclosure covers all modifications, equivalents or alternatives falling in the spirit and technical scope of the present disclosure.

The terms "first", "second", and the like may be used to describe various elements, but the elements are not limited by the terms. These terms are used to distinguish one element from another.

It will be further understood that when an element is referred to as being "connected to" another element, it can be directly connected to the other element or intervening elements may be present.

As used herein, the singular forms are intended to include the plural forms as well, unless the context clearly indicates otherwise.

It will be understood that the term "comprises" or "includes" when used in this specification, specifies the presence of stated features, integers, steps, operations, elements, components or groups thereof, but does not preclude the presence or addition of one or more other features, integers, steps, operations, elements, components, or groups thereof.

Hereinafter, a method (S100) of manufacturing a shear and normal force sensor and a shear and normal force sensor 100 according to the present disclosure will be described with reference to the accompanying drawings.

Referring to FIG. 1, the method (S100) of manufacturing a shear and normal force sensor according to the present disclosure includes the step (S10) of fabricating raised and sunken polymers 10a, 10b having a plurality of bent parts of bent shapes, the step (S20) of forming an electrode pattern on one surface of a piezoelectric element 20, and the step (S30) of embedding the piezoelectric element 20 between the raised and sunken polymers 10a, 10b.

Additionally, the method (S100) of manufacturing a shear and normal force sensor according to the present disclosure may further include the step (S40) of embedding a flexible printed circuit board (FPCB) 30 between the sunken polymer 10b and the piezoelectric element 20. The FPCB 30 is electrically connected to the electrode pattern on said one surface of the piezoelectric element 20 to measure the output of the sensor.

In the step (S10) of fabricating the raised and sunken polymers 10a, 10b having a plurality of bent parts of bent shapes, the bent part may have a trapezoidal shape.

Additionally, the shapes of the raised and sunken polymers 10a, 10b may match each other.

For example, each of the raised and sunken polymers 10a, 10b may be made of an elastic polymer, for example, polydimethylsiloxane (PDMS).

The piezoelectric element 20 may have an electrode on two surfaces, and the electrode pattern is formed on one of the two surfaces.

In the step (S20) of forming the electrode pattern on one surface of the piezoelectric element 20, the electrode pattern may be formed, for example, by laser cutting. Additionally, the piezoelectric element 20 may be, for example, a piezoelectric film made of polyvinylidene fluoride (PVDF), i.e., a PVDF film.

The piezoelectric element 20 generates voltage when an external force is applied, and thus does not need an external power.

Additionally, the shear and normal force sensor 100 manufactured by the method (S100) of manufacturing a shear and normal force sensor according to the present disclosure is made only of flexible materials, and thus the entire sensor is flexible.

The shear and normal force sensor 100 of the present disclosure includes raised and sunken polymers 10a, 10b having a plurality of bent parts of bent shapes, a piezoelectric element 20 embedded between the raised and sunken polymers 10a, 10b and having an electrode pattern on one surface, and a FPCB 30 embedded between the sunken polymer 10b and the piezoelectric element 20 and electrically connected to the electrode pattern.

Hereinafter, an example of the method (S100) of manufacturing a shear and normal force sensor according to the present disclosure will be described in more detail.

First, two custom-made molds are manufactured with a 3-dimensional (3D) printer. The molds are coated with trichlorosilane to easily separate the raised and sunken polymers 10a, 10b from the molds. As shown in FIG. 2A, the raised and sunken polymers 10a, 10b are molded using the custom-made molds and cured at 55° C. for 4 hours to form the bottom and top surfaces of the raised polymer 10a and the sunken polymer 10b.

Figure 2B:
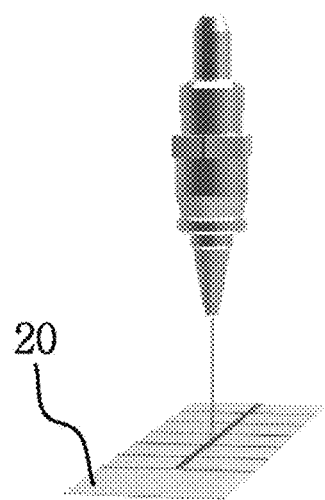
FIG. 2B is a perspective view showing an electrode pattern process of a silver-coated polyvinylidene fluoride (PVDF) film using a laser.
Figure 2C:
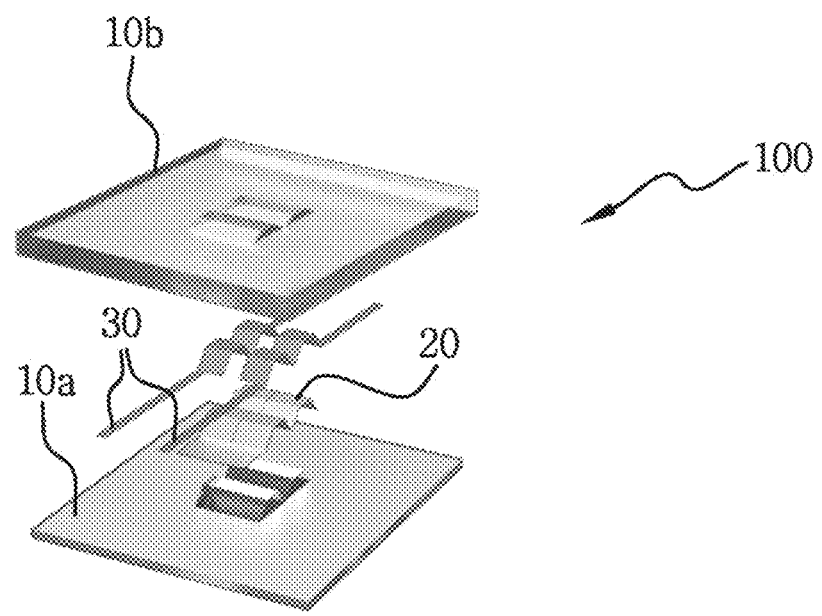
FIG. 2C is a perspective view showing an example of manufacturing a shear and normal force sensor of the present disclosure by assembly of PDMS, a PVDF film and a flexible printed circuit board (FPCB).
Figure 2D:
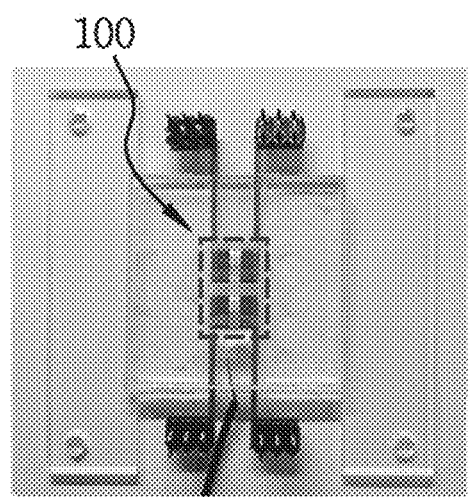
FIG. 2D is a photographic image showing an example including a photographic image of a shear and normal force sensor of the present disclosure.
Figure 2E:
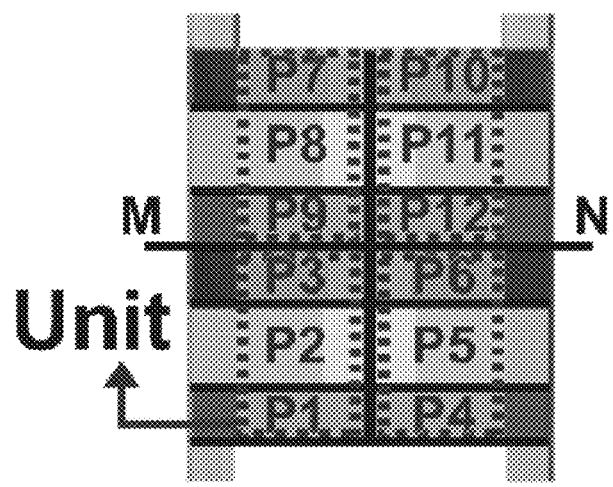
FIG. 2E is a conceptual diagram showing a 2*2 array of a shear and normal force sensor in FIG. 2D.

As shown in FIG. 2B, an upper surface electrode of a silver-coated PVDF film of 6*23 mm$^2$ is patterned by a laser marking machine. For example, the PVDF film is 28 μm in thickness. Referring to FIG. 2C, an example is shown in which the patterned PVDF layer and a FPCB 30 layer are stacked on the bottom raised polymer 10a, and afterwards, the top sunken polymer 10b covers the PVDF layer and the FPCB 30. FIGS. 2D and 2E show photographic images of the shear and normal force sensor of a 2*2 sensor array. The sensor module may include three piezoelectric sensors, for example, P1, P2 and P3 of FIG. 2E. FIG. 2E shows an example of 2*2 sensor array in total, P1 to P3 are #1 sensor, P4 to P6 are #2 sensor, P7 to P9 are #3 sensor, and P10 to P12 are #4 sensor.

Figure 2F:
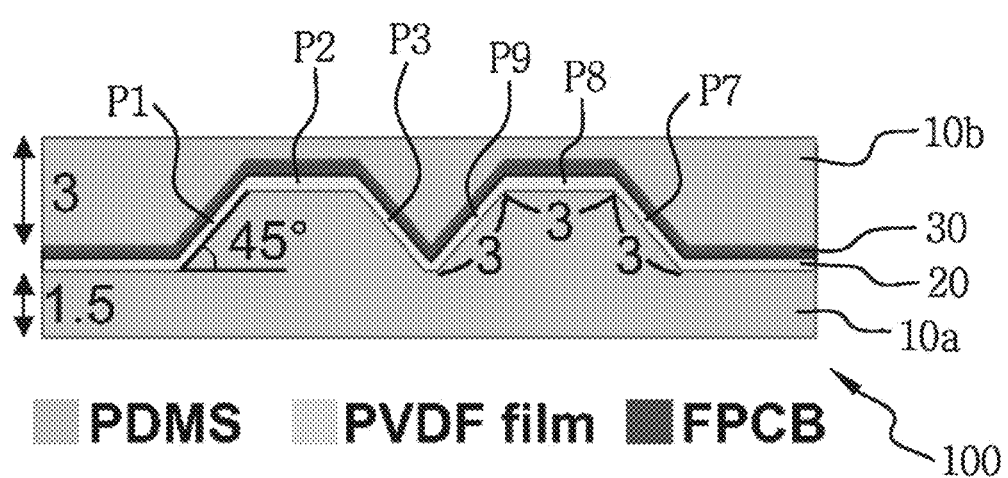
FIG. 2F is a cross-sectional view of a shear and normal force sensor of the present disclosure.

Seeing the side view of FIG. 2F, the bottom raised polymer 10a in the shape of two isosceles trapezoid bumps is shown. The length from the bottom base to the upper surface of the trapezoid shape may be 3 mm, and the angle between the bottom base and the slope surface of the trapezoid shape may be 45°. FIG. 2F shows an example of P1 to P3 parts and P9 to P7 parts in the PVDF film of trapezoidal shape. Although P4 to P6 parts and P12 to P10 parts of FIG. 2E are not shown in cross section, it will be understood that they are the same as P1 to P3 parts and P9 to P7 parts. To measure the sensor outputs, the FPCB 30 may be connected to the top surface electrode of the PVDF film, and an electric wire may be connected to the bottom surface electrode.

Figure 3A:
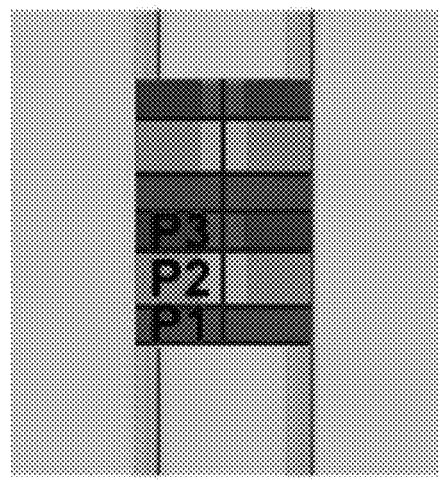
FIG. 3A is a conceptual diagram showing a shear and normal force sensor of the present disclosure to which a shear and normal force is to be applied.
Figure 3B:
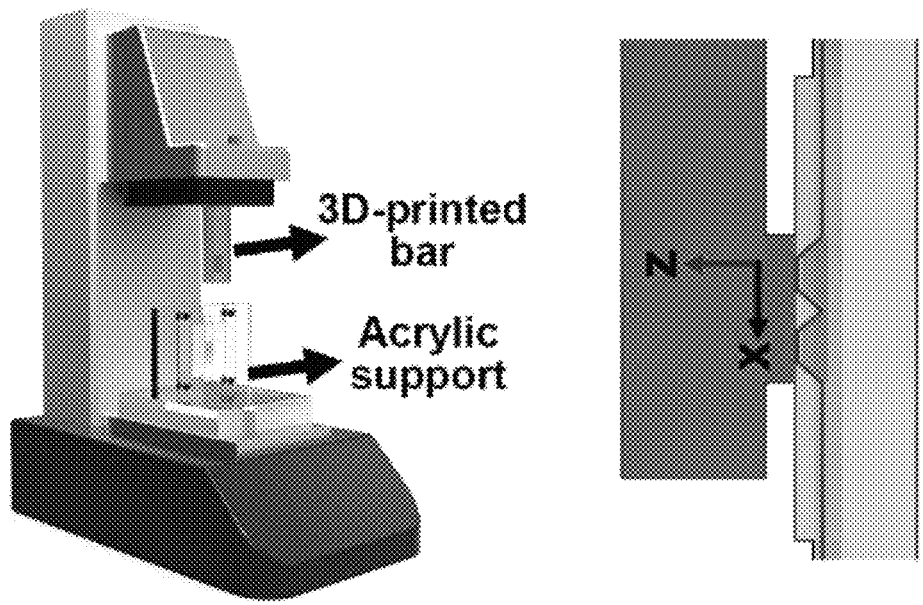
FIG. 3B is a schematic diagram of an experiment equipment with a 3-dimensional (3D)-printed bar and a vertically positioned sensor during a shear force test.
Figure 3C:
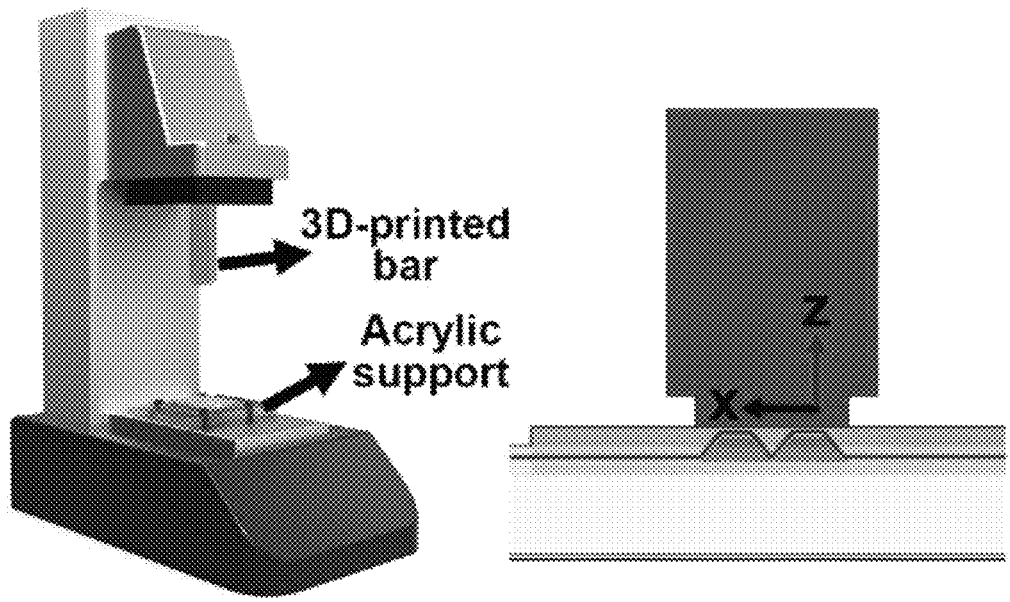
FIG. 3C is a schematic diagram of an experiment equipment with a 3D-printed bar and a horizontally positioned sensor during a normal force test.

To analyze the performance of the shear and normal force sensor, a tensile testing machine for applying normal and shear forces is used. As shown in FIG. 3B, by connecting a 3D-printed bar to the tensile testing machine, a force may be applied to an area of 8 mm*14.7 mm in FIG. 3A. Moreover, the manufactured sensor array may be fixed on an acrylic support to position the sensor horizontally or vertically. As shown in FIG. 3B, for the shear force tests, the sample is vertically oriented direction and the test speed is 300 mm/min. The 3D-printed bar for the shear force is designed as shown in FIG. 3B. As shown in FIG. 3C, for the normal force tests, the sample is vertically oriented and the test speed is 150 mm/min. When the normal force is applied, as shown in FIG. 3C, a different bar for the shear force tests is used.

Figure 4A:
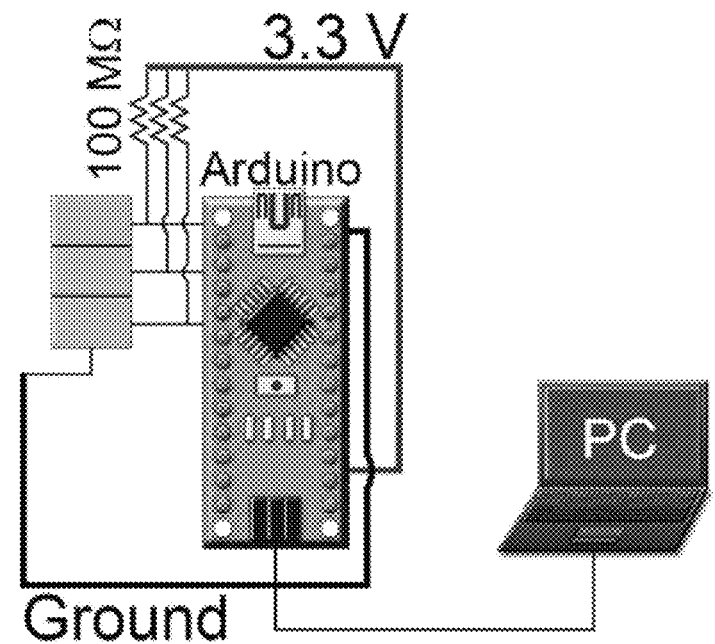
FIG. 4A is a conceptual diagram showing a sensor system for single unit measurement.

The setup of sensor output measurement for one module is shown in FIG. 4A. In detail, signals from P1, P2 and P3 sensors are observed. The analog voltages are read via analog-digital conversion pins. A load resistor of 100 MΩ is connected to each sensor, and the analog voltage output is measured in the positive value region by applying an offset voltage of 3.3 V. The sampling rate is 300 Hz, and a personal computer (PC) for data processing is connected to a microcontroller through a serial communication method. For the full testing of the 2*2 sensor array, 12 signals are measured using a 16-channel analog multiplexer and controlled via the microcontroller. Since the number of sensors increases, the sampling rate is adjusted to 50 Hz.

Figure 5A:
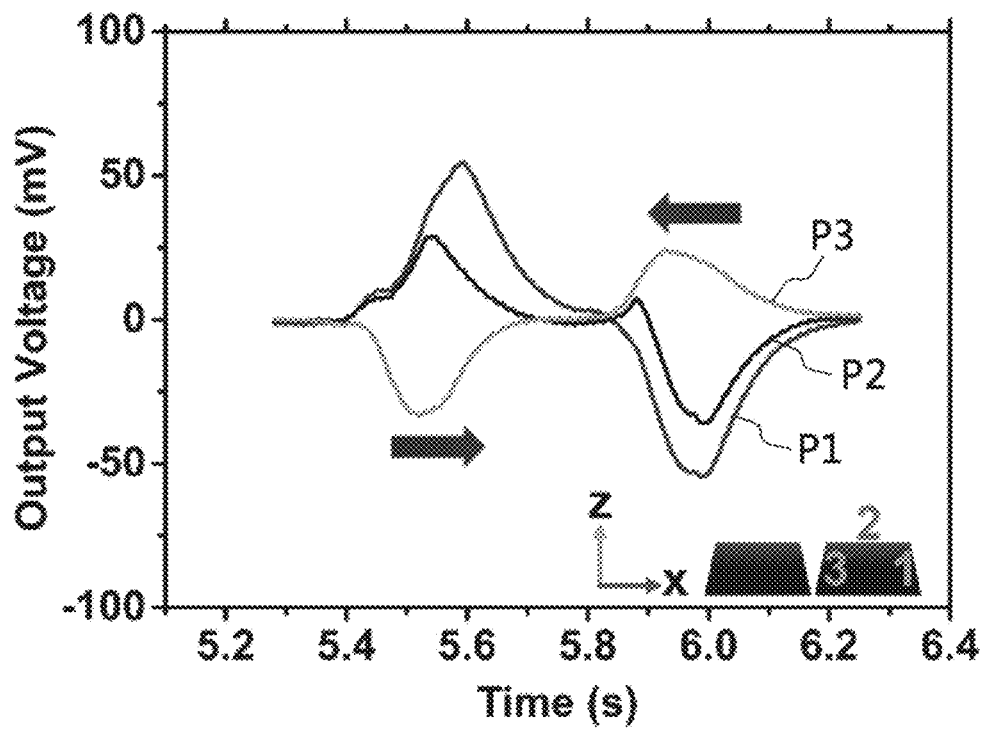
FIG. 5A is a graph showing output voltages of a force sensor module when a shear force of 75.67 kPa is applied.
Figure 5B:
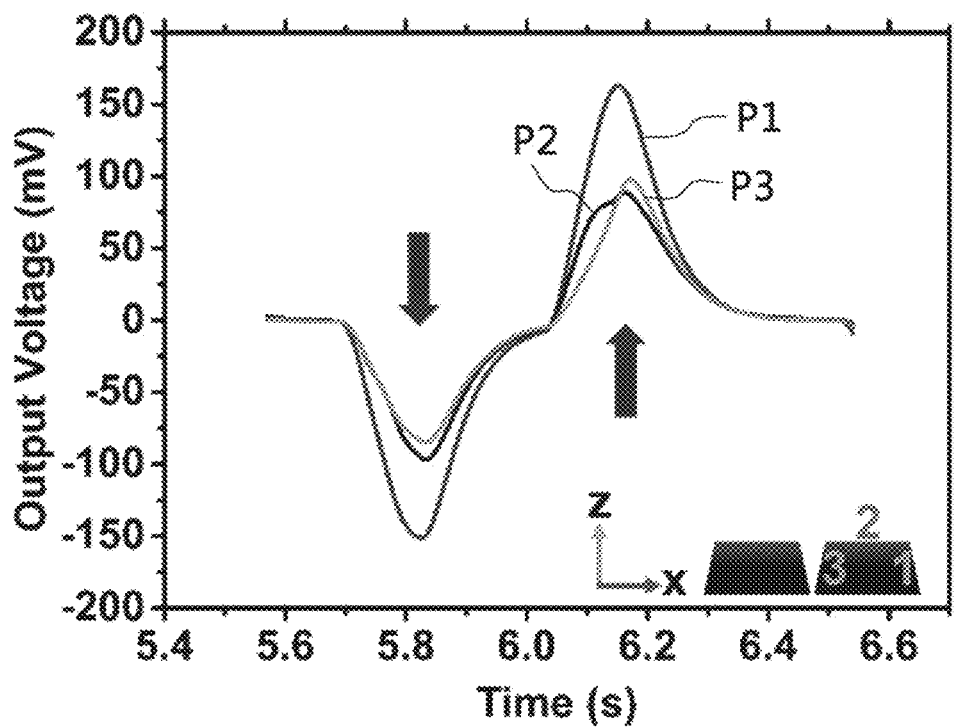
FIG. 5B is a graph showing output voltages of a force sensor module when a normal force of 96.17 kPa is applied.

FIGS. 5A and 5B show the output voltages of the sensor when shear and normal forces are applied and released. The voltage offsets of the obtained data are removed, and the voltage outputs are filtered by a low pass filter (LPF) of 60 Hz to remove power source noise. The inset images show the position of the sensor reading the voltage, and the red arrows show the movement direction of the 3D-printed bar for the shear and normal force tests. FIG. 5A shows the measurement results when a 75.67 kPa shear force is applied in the +x direction. The signal phases of the P1 and P2 sensors appear to be opposite the signal phase of the P3 sensor. FIG. 5B shows the signals when a normal force in the z direction is applied. The signals have the same phase when the force is applied or released. Therefore, it is possible to determine whether the force applied to the signal is shear or normal by comparing a phase difference of the signals. However, the PVDF sensor produces a voltage proportional to the change in strain when the load resistor is under the internal impedance value of the sensor. The peak value of the output voltage depends on the speed at which the force is applied, and the magnitude of the force applied to the sensor cannot be obtained from the peak value of the output voltage. To obtain the magnitude of the force applied to the sensor, [Equation 1] is given:

[Equation 1] is $I_n = I_{n-1} + V_n * \Delta t$. Here, $I_n$ is the processed value, $V_n$ is the output voltage with no offset, and $\Delta t$ is the sensing time interval.

Figure 6A:
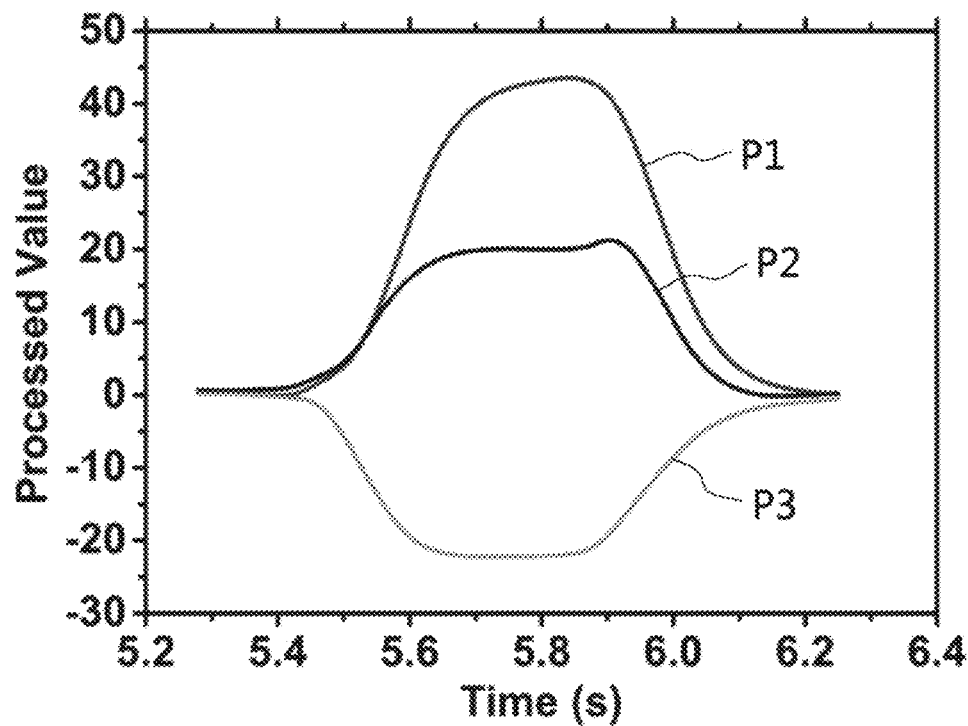
FIG. 6A is a graph showing processed values from output voltages of a sensor module when a shear force of 75.67 kPa is applied.
Figure 6B:
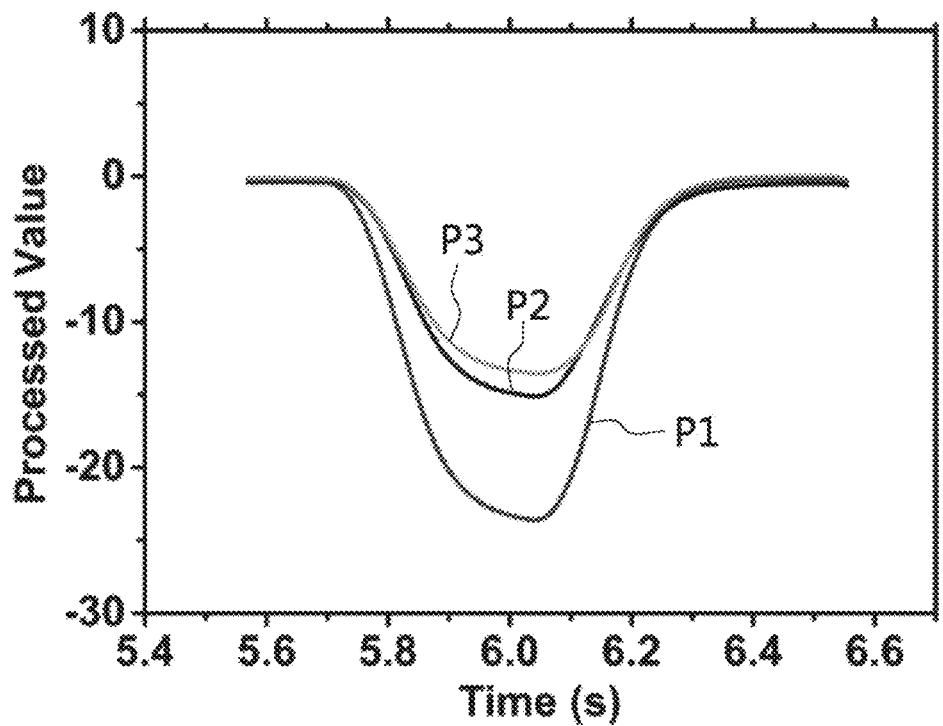
FIG. 6B is a graph showing processed values from output voltages of a sensor module when a normal force of 96.17 kPa is applied.

The peak value of the processed value is proportional to the force applied to the sensor irrespective of the speed. As shown in FIG. 6A, when a shear force is applied in the +x direction, the P1 sensor generates a positive value, whereas the P3 sensor generates a negative value. As shown in FIG. 6B, when a normal force is applied in the −z direction, the P1 and P3 sensors generate negative values. According to these results, the direction of the force applied to the sensor may be the x direction or the z direction depending on the polarity of the processed value of the P1 and P3 sensors. That is, if $I_1 * I_3 < 0$, a shear force is applied, and if $I_1 * I_3 > 0$, a normal force is applied.

Furthermore, the magnitude of the applied force may be measured through the peak value of the processed value. To study the sensitivity of the applied force through the sensor, additional experiments using the sensor are performed by applying different shear and normal forces in the range of 45 to 86 kPa and 100 to 260 kPa, respectively.

Figure 7A:
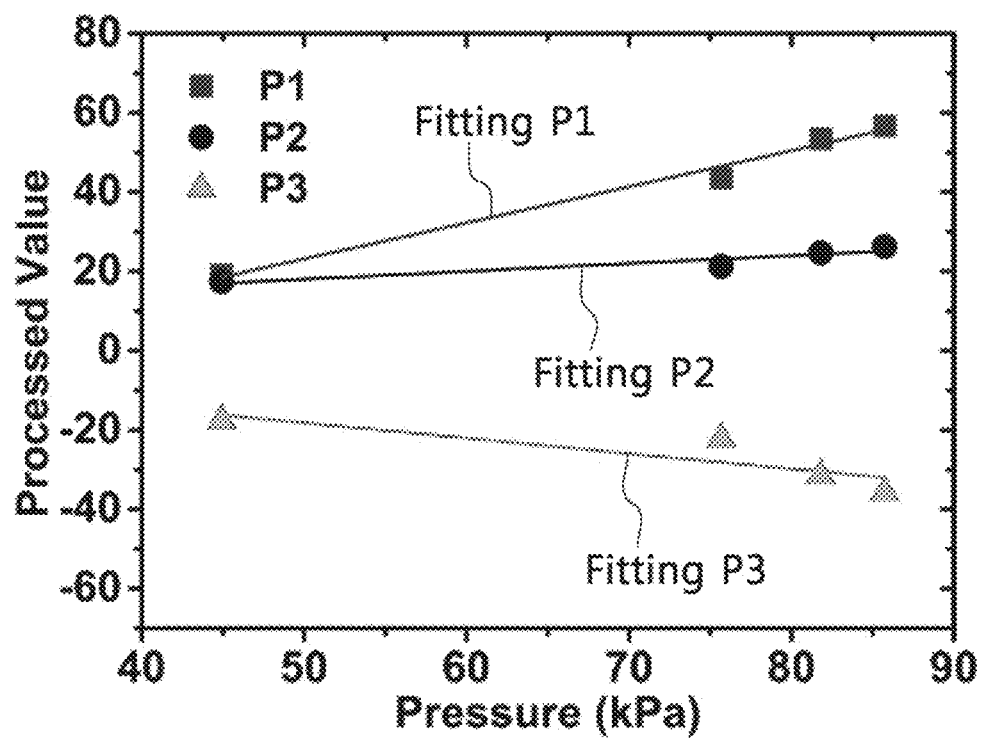
FIG. 7A is a graph showing processed values of a sensor module under different pressures in +x direction.
Figure 7B:
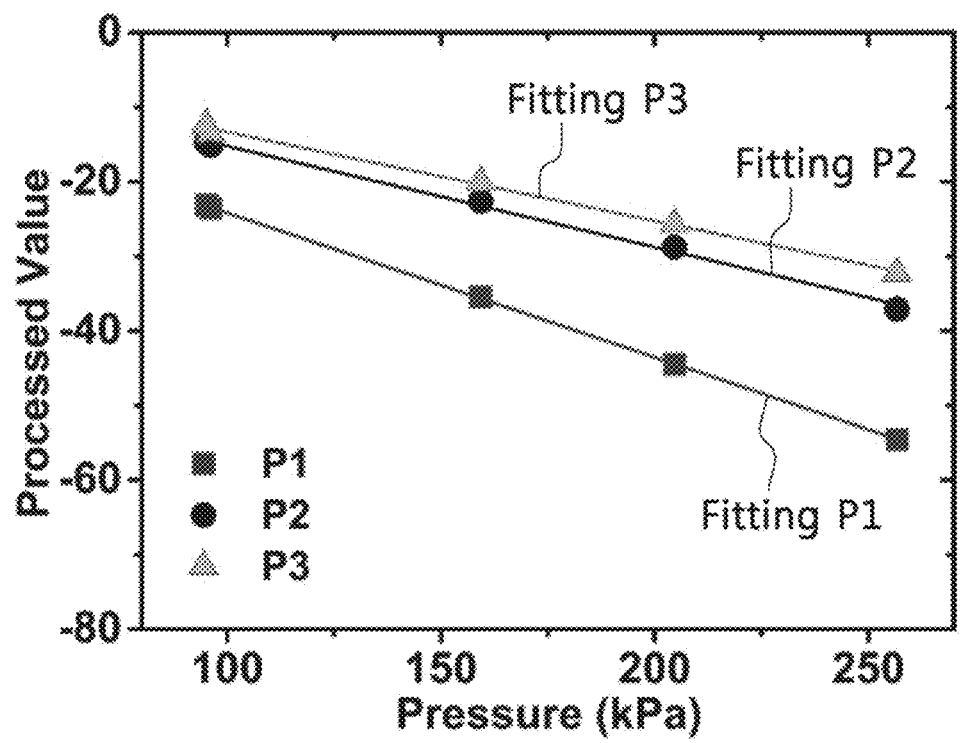
FIG. 7B is a graph showing processed values of a sensor module under different pressures in −z direction.
Figure 7C:
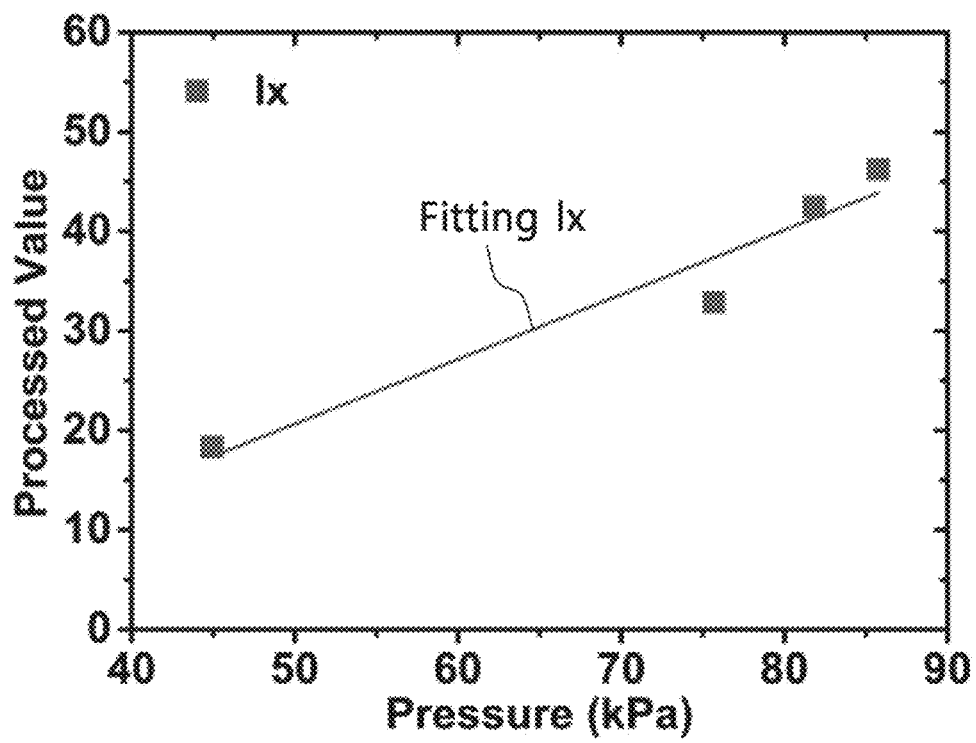
FIG. 7C is a graph showing a calculated value $I_x$ and pressure in +x direction.
Figure 7D:
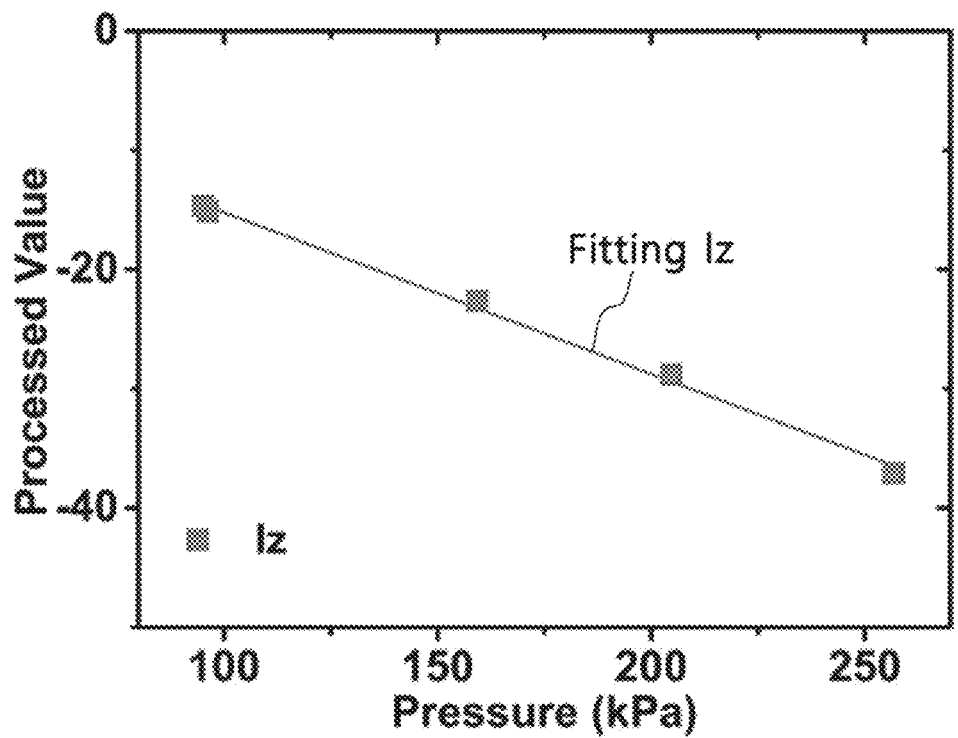
FIG. 7D is a graph showing a calculated value $I_z$ and pressure in −z direction.

FIGS. 7A and 7B show processed value vs pressure. As the applied pressure increases, the absolute value of the processed value linearly increases, and linear fittings are overlapped with these results to compare the sensitivity of each sensor. When a shear force is applied on the sensor, the slopes of the fitting lines of the P1, P2, and P3 sensors are 0.91, 0.198, and −0.39. At this point, the sensors P1 and P3 located on the leg of the trapezoid bump are relatively more sensitive than the sensor P2 located on the upper base of the trapezoid bump. When a normal force is applied, the slopes of the fitting lines are −0.194, −0.119, and −0.135. Because of the different sensitivities of the sensors, the shear force is detected using the P1 and P3 sensors with their signals that are particularly sensitive to shear forces. Additionally, the normal force is detected using the sensor P2. In particular, the force applied to the sensor may be decomposed into $F_z$ of the normal force and $F_x$ of the shear force. $F_x$ is expressed as a function of $I_x$, which is defined by signals of the P1 and P3 sensors, and the equation is Ix=(I1−I3)/2 where I1 and I3 are the processed values of P1 and P3 sensors respectively. Moreover, $F_z$ is expressed as a function of $I_z$, which is defined as $I_z$=I2 where I2 is the processed value of the P2 sensor. According to these definitions, $I_x$ and $I_z$ are plotted in FIGS. 7C and 7D respectively. Referring to FIG. 7C, $I_x$ is mainly affected by a change in the corresponding shear force component $F_x$ and had linearity with respect to the shear force, and referring to FIG. 7D, $I_z$ has the same tendency as that of $F_z$. As a result, it is possible to deduce whether the force applied to the sensor is shear or normal and its magnitude.

Moreover, to observe the morphology of the film under a shear or normal force, the total displacement distribution of the PVDF film is analyzed using the Finite Element Method (FEM) procedure in the COMSOL Multiphysics software. Modeling is set up such that geometry is equal to the actual size of the sensor, the top sunken polymer 10b modulus is set to 3590 kPa, and the bottom raised polymer 10a modulus is set to 980 kPa.

Figure 4B:
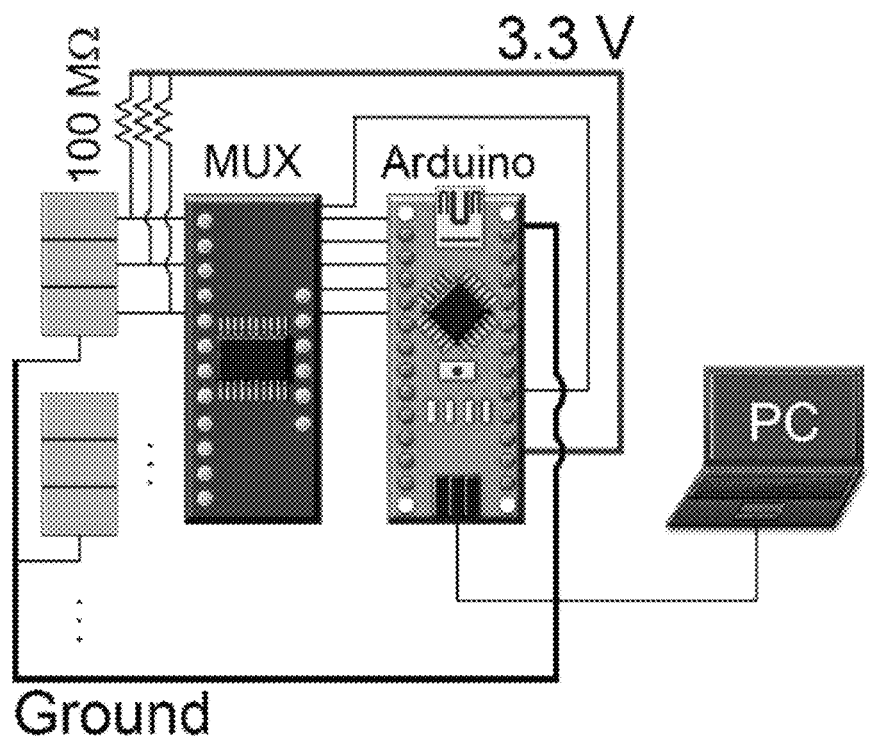
FIG. 4B is a conceptual diagram showing a sensor system for real-time sensor array.
Figure 8A:
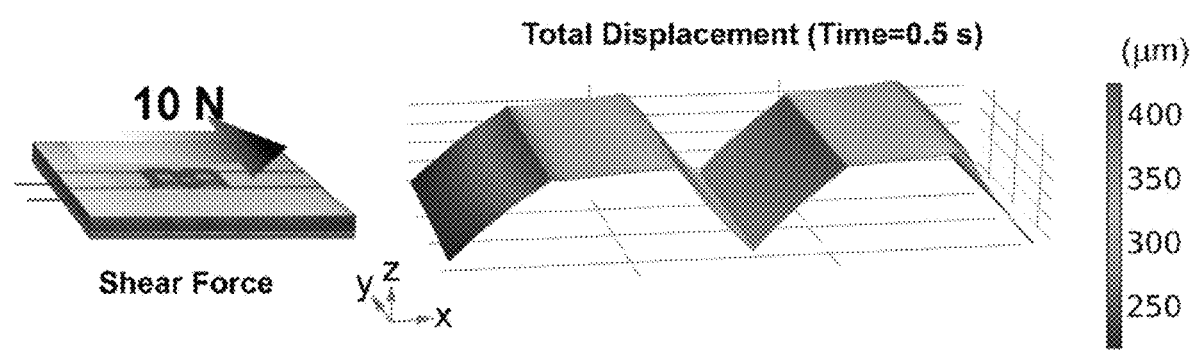
FIG. 8A is a graph showing the result of the finite element method for displacement distribution of a PVDF film when a shear force is applied, and at that time, a force acting on a sensor.
Figure 8B:
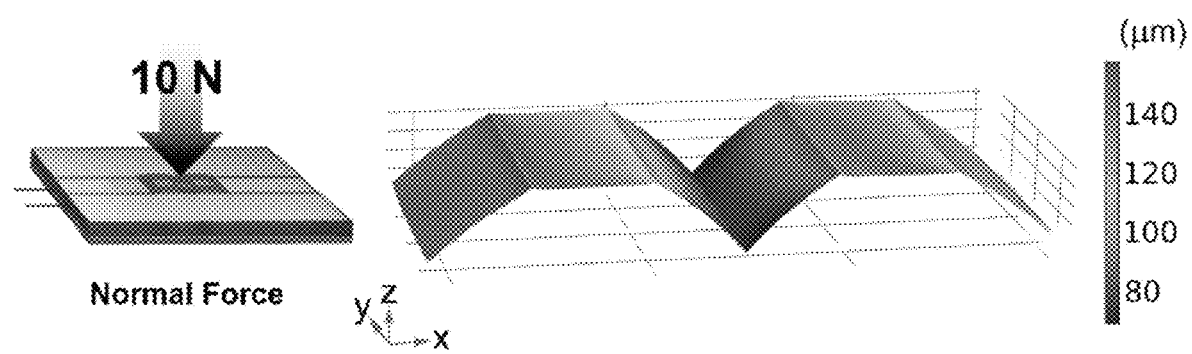
FIG. 8B is a graph showing the result of the finite element method for displacement distribution of a PVDF film when a normal force is applied, and at that time, a force acting on a sensor.
Figure 9A:
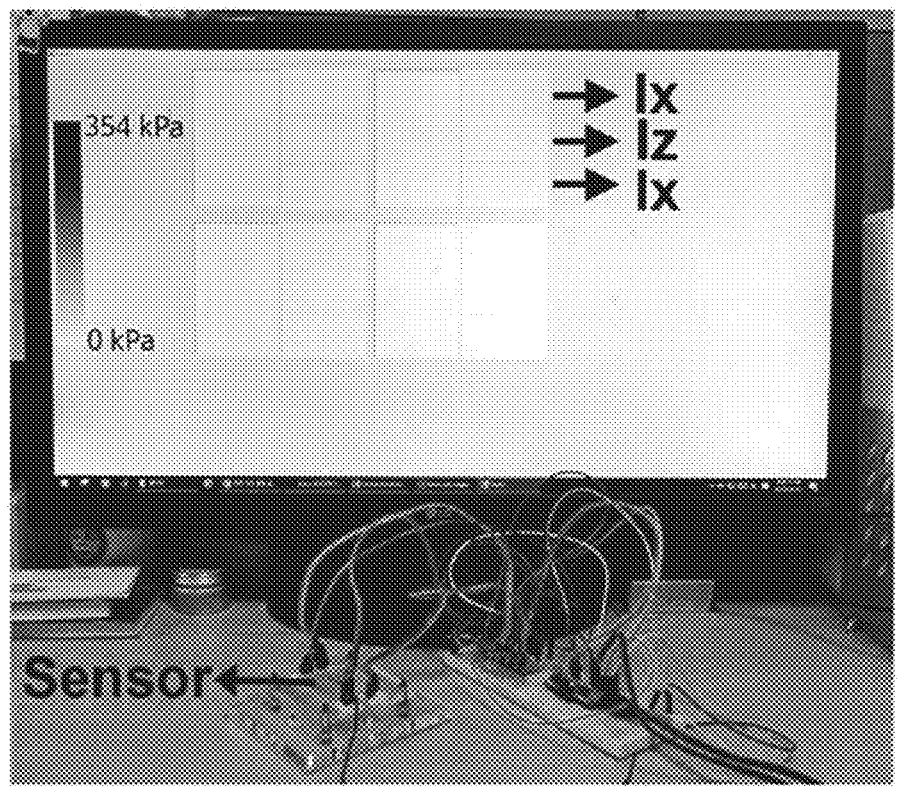
FIG. 9A is a photographic image showing the test of a real-time force sensing system that measures the magnitude and direction of force components Fx and Fz.
Figure 9B:
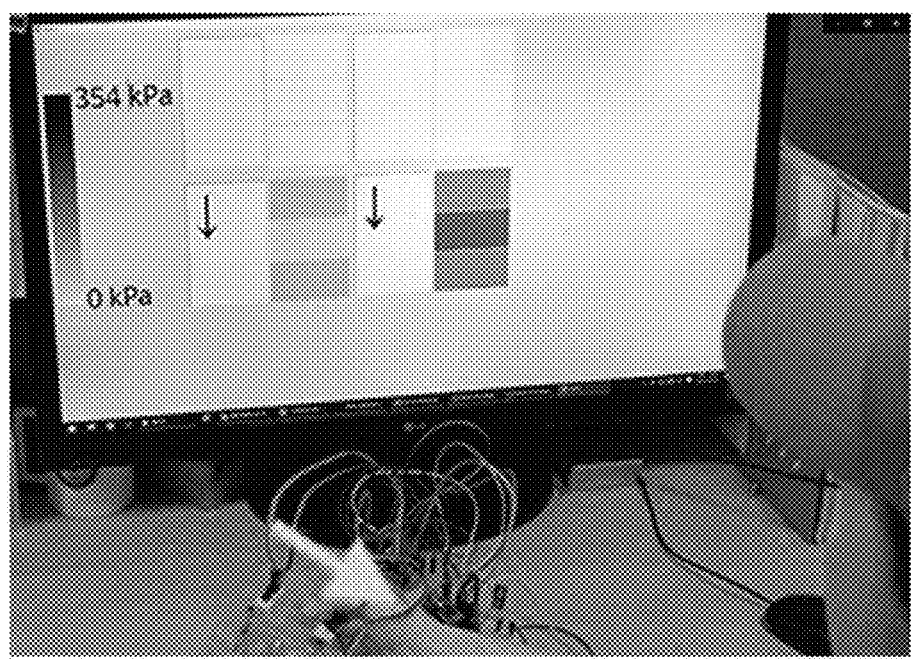
FIG. 9B is a photographic image showing the test of a real-time force sensing system that measures the magnitude and direction of force components Fx and Fz when a shear force is applied.
Figure 9C:
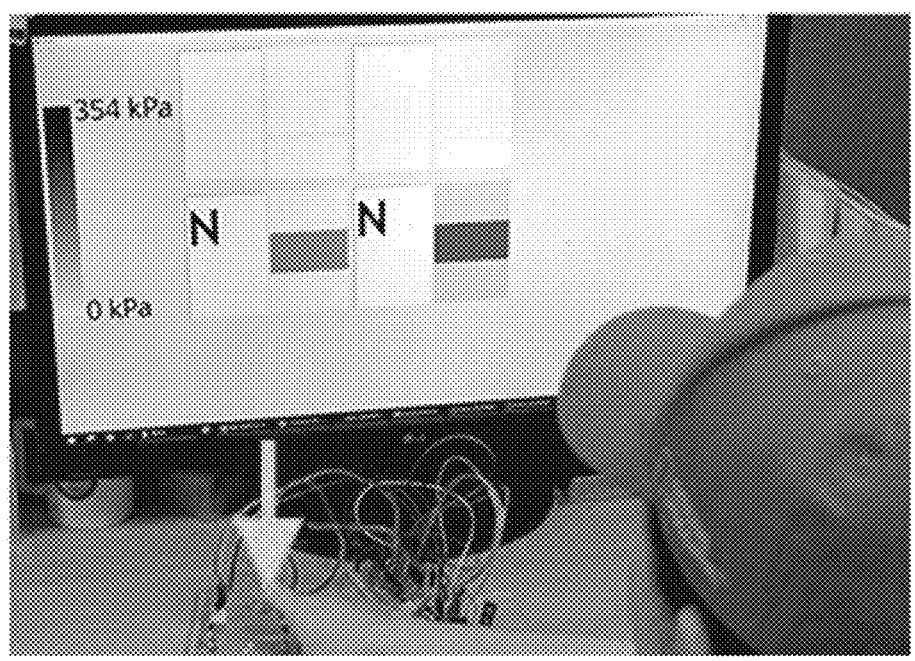
FIG. 9C is a photographic image showing the test of a real-time force sensing system that measures the magnitude and direction of force components Fx and Fz when a normal force is applied.

In the simulation, shear and normal forces are applied to the sensor modules. The displacement distributions when a shear force of 10N and a normal force of 10N are applied are shown in FIGS. 8A and 8B respectively. The morphology of the film of one domain may be observed when the force is applied to the sensor. In both cases, the upper base of the trapezoid has the largest displacement, and the displacement distribution is symmetrical with respect to the line MN in FIG. 2E. This result shows that connection of two trapezoids affects the symmetric displacement. The connection is possible because the sensor is manufactured by using one layer of PVDF film. Moreover, a displacement difference by the connection is due to a sensitivity difference between the P1 and P3 sensors. For a practical application, a real-time measurement system is provided for the shear and normal force sensor through the proposed data processing. Among the four sensor modules, the force is applied to the two lower sensor modules. The force components $F_x$ and $F_z$ are measured using the sensing system shown in FIG. 4B and displayed on a computer screen. In FIG. 9A, each sensor module has a window in gray corresponding to the magnitude of the force, and the direction of the applied force is also seen. In detail, one module has three windows indicating the magnitude of the applied force. The window for the two sensors located on the leg of the trapezoid bump represents the magnitude of $F_x$, and the window for the sensor located on the upper base of the trapezoid bump represents the size of $F_z$. FIG. 9B shows the system results of the shear force test, while FIG. 9C shows the system results of the normal force test. When the shear force is applied, the normal force is also observed. This shows that when the shear force is applied, the normal force component exists. On the contrary, when the normal force is applied, $F_x$ significantly reduces and $F_z$ becomes dominant. Additionally, in both cases, since the forces are applied by a human finger, there is a difference between the forces applied to each module.

The shear and normal force sensor 100 of the present disclosure is a flexible piezoelectric sensor, and can sense shear and normal forces and may be manufactured using a layer of a PVDF film. This sensor with a 2*2 array includes the PVDF film sealed by the raised and sunken polymers 10a, 10b of 3D structure. Particularly, this sensor is advantageous in terms of the manufacturing process since it is manufactured by simply patterning the electrode with a laser cutting machine on the PVDF film without complex processing. Through the results of data processing of the sensor output voltages, a value proportional to the magnitude of the applied force is obtained. Particularly, the signals generated by three sensors P1, P2 and P3 in a single module show different phases, and thus the direction of the applied force is derived. Additionally, since the peak value of the processed value is proportional to the pressure applied to the sensor, the magnitude of the force may be also derived by using the peak value of the data processed sensor output voltage. Moreover, the morphology of the PVDF film of one domain is studied by the FEM when a force is applied, and the results show that a difference in sensitivity between the P1 and P3 sensors is due to the connection by one domain of the PVDF film. Moreover, the sensor array system is provided to sense the force applied to the sensor in real time. When an unknown force is applied to the sensor, the system displays the direction and magnitude of the force on the computer screen in real time.

The raised and sunken polymers 10a, 10b of 3D trapezoidal structure seals a layer of PVDF film enabling the sensing of shear and normal forces. The capability of the sensor is investigated by applying forces in various directions, and the direction and magnitude of the applied forces is measured.

The method (S100) of manufacturing a shear and normal force sensor according to the present disclosure does not need to apply an external voltage due to the use of a piezoelectric sensor, and senses using the strain of the piezoelectric sensor.

The method (S100) of manufacturing a shear and normal force sensor according to the present disclosure has wearable device applications since the sensor can be attached and used for curved robotic arms or artificial hands due to having flexibility.

The method (S100) of manufacturing a shear and normal force sensor according to the present disclosure only includes a simple manufacturing process: fabrication of elastic polymer; electrode patterning of a piezoelectric film; and assembling of the components, and does not need a micro/nano process, and thus is performed in a very simple manner.

Additionally, when a force is applied, the morphology of the PVDF film consisting of one domain is investigated by the FEM procedure, and finally, the real-time measurement system for a practical application of the sensor array is provided. The sensing system may sense the magnitude and direction of an unknown force applied to the sensor in real time.

The method of manufacturing a shear and normal force sensor according to the present disclosure has wearable device applications since the sensor can be attached and used for curved robotic arms or artificial hands due to having flexibility.

Additionally, the method of manufacturing a shear and normal force sensor according to the present disclosure only includes a simple manufacturing process: fabrication of elastic polymer; electrode patterning of a piezoelectric film; and assembling of the components, and does not need a micro/nano process, and thus is performed in a very simple manner.

Additionally, when a force is applied to the shear and normal force sensor of the present disclosure, the morphology of the PVDF film consisting of one domain is investigated by the FEM procedure, and finally, the real-time measurement system for a practical application of the sensor array is provided. The sensing system can sense the magnitude and direction of an unknown force applied to the sensor in real time.

The method (S100) of manufacturing a shear and normal force sensor and the shear and normal force sensor 100 as described hereinabove is not limited to the configuration and method of the embodiments described above, and all or some of the embodiments may be selectively combined to make various modification.

It is obvious to those skilled in the art that the present disclosure may be embodied in other particular forms without departing from the spirit and essential features of the present disclosure. Therefore, the above detailed description should not be interpreted as being limiting in all aspects and should be considered as being exemplary. The scope of the present disclosure should be determined by the reasonable interpretation of the appended claims, and the scope of the present disclosure covers all modifications within the equivalent scope of the present disclosure.

What is claimed is:

1. A method of manufacturing a shear and normal force sensor, comprising:
    fabricating raised and sunken polymers having a plurality of bent parts of bent shapes;
    forming an electrode pattern on one surface of a piezoelectric element; and
    embedding the piezoelectric element between the raised and sunken polymers;
    wherein
        the fabricating includes fabricating a sunken polymer of the sunken polymers to have at least one recess shaped to fit a raised shape of a raised polymer of the raised polymers;
        the fabricating the raised polymers includes fabricating a substantially planar base portion and raised portions in a center region of the base portion,
        the fabricating the raised positions includes fabricating a first sloped portion extending from the base portion, a substantially planar top portion extending from an end of the first sloped portion, and a second sloped portion extending from an end of the top portion toward the base portion, and
        the fabricating the raised portions further includes fabricating a pair of the raised portions to be adjacent to each other and separated by a V-shaped recess.

2. The method of manufacturing a shear and normal force sensor according to claim 1, further comprising:
    embedding a flexible printed circuit board (FPCB) between the sunken polymer of the sunken polymers and the piezoelectric element.

3. The method of manufacturing a shear and normal force sensor according to claim 1, wherein a bent part of the plurality of bent parts has a trapezoidal shape.

4. The method of manufacturing a shear and normal force sensor according to claim 1, wherein shapes of the raised and sunken polymers match each other.

5. The method of manufacturing a shear and normal force sensor according to claim 1, wherein each of the raised and sunken polymers is made of polydimethylsiloxane (PDMS).

6. The method of manufacturing a shear and normal force sensor according to claim 1, wherein the piezoelectric element is made of polyvinylidene fluoride (PVDF).

* * * * *